United States Patent [19]

Elabd

[11] Patent Number: 4,584,523
[45] Date of Patent: Apr. 22, 1986

[54] MEASUREMENT OF THE CURRENT FLOW IN AN ELECTRIC POWER TRANSMISSION LINE BY DETECTION OF INFRARED RADIATION THEREFROM

[75] Inventor: Hammam Elabd, East Windsor, N.J.

[73] Assignee: RCA Corporation, Princeton, N.J.

[21] Appl. No.: 538,548

[22] Filed: Oct. 3, 1983

[51] Int. Cl.$^4$ ............................................. G01R 31/00
[52] U.S. Cl. ........................................ 324/96; 324/105; 324/106
[58] Field of Search .................. 324/96, 105, 106, 104; 250/338

[56] References Cited

U.S. PATENT DOCUMENTS 3,312,895  4/1967  Garbuny ............................... 324/96
3,411,069  11/1968  Kubler et al. ......................... 324/96

OTHER PUBLICATIONS

Leslie, J. et al., "Detection of Overhead Transmission Line Joints by Means of a Bolometer", AIEE Technical Paper 49-9, Dec. 1948.
Davis, M., "A New Thermal Rating Approach . . . ", IEEE Transactions on Power Apparatus and Systems, vol. PAS 96, No. 3, May/Jun. 1977, pp. 803-809.
Vanzetti, R., "Infrared Radiation: A New Dimension for Production Reliability and Maintainability", Reliability and Maintainability Conference, Washington, D.C., May 1963, pp. 239-251.
Klass, P., "Use of Infrared Testing Technique Grows", Aviation Week & Space Technology, May 4, 1964, pp. 82-90.
S. Isawa, D. Lamb and D. Paffel of Honeywell, "Mosaic CCD Multiplexer for Pyroelectric Hybrid Focal Plane", paper presented in Sep. 1979 at the University of Edinburgh, pp. 33-39.

Primary Examiner—Stewart J. Levy
Assistant Examiner—Stephen M. Baker
Attorney, Agent, or Firm—Joseph S. Tripoli; George E. Haas; Allen L. Limberg

[57] ABSTRACT

Passage of current through a power transmission line causes infrared radiation therefrom. The construction of a high-tension (HT) line with counterwound helical conductors for current around a supporting core minimizes the surrounding magnetic field, reducing the skin resistance of the line per unit length as compared to its bulk resistance per unit length. Infrared radiation from the $I^2R$ losses in the line is thus linearized, and the current in the line can be indirectly measured by sensing the infrared radiation from the line itself using infrared detectors.

4 Claims, 2 Drawing Figures

MEASUREMENT OF THE CURRENT FLOW IN AN ELECTRIC POWER TRANSMISSION LINE BY DETECTION OF INFRARED RADIATION THEREFROM

FIELD OF INVENTION

The present invention relates to the measurement of current flow in power transmission lines.

BACKGROUND OF THE INVENTION

In present day practice current measurement on multi-kilovolt transmission lines is performed using current transformers, with the lines carry polyphase currents acting as primary windings, and with secondary windings operated near ground potential. The windings of the current transformers have to be electrically isolated with electrical insulation that will withstand the multi-kilovolt potential between them. The multiple-core transformer used for polyphase line voltage and current monitoring costs several thousand U.S. dollars, installed. The continuing measurement of active power in a set of power transmission lines is of concern to avoid overloading them. It is customary to use four current transformers delivering secondary currents up to 5A and three voltage transformers delivering secondary voltages up to 110 or 220 in each phase of a three-phase high-tension (HT) transmission line. The secondary winding of one of the current transformers is used in power measurement and the secondary windings of the others are loaded with relays used in protection against undesirable over-current, ground-fault, line-fault, distance, over-voltage, directionality, under-current and under-voltage conditions.

Garbuny in U.S. Pat. No. 3,312,895 issued April 4, 1967 and entitled "Transmission Line Monitor Apparatus Utilizing Electromagnetic Radiation between Line and a Remote Point" has described coupling to an infrared radiating device a portion of the power which is radiated from an HT power transmission line into a surrounding electro-magnetic field. The radiation from the infrared-radiating device is then remotely sensed with an infrared detector cell to generate a signal indicative of the current passing through the transmission line. This scheme is unattractive since an infrared-radiating device and its associated parabolic reflector must be installed on the multi-kilovolt transmission line which introduces problems with power system reliability. The installation then has to be maintained without having to shut down transmission. The installation also precludes portability in the measuring equipment.

Further, modern HT transmission lines are typically constructed with a steel supporting core wound around with helices of aluminum conductor, and these helices are counterwound to diminish substantially the surrounding electromagnetic field that undesirably cause conduction only near the conductor surface. This lessens the power available for the Garbuny device. This construction desirably reduces the skin effect which causes the resistance of the conductor to vary as a function of current and to exhibit a departure from linear change in resistance with increasing temperature. The bulk resistance of the conductor becomes substantially the entire resistance, or R, term in determining the $I^2R$ loss along a length of the line; and the linear increase in the bulk resistance with increased temperature facilitates the measurement of current in the conductor by proceeding from the temperature of the conductor itself, as is done in the present invention.

BRIEF SUMMARY OF THE INVENTION

In the present invention, the current transmission through a power transmission line is determined using an infrared camera to sense the temperature of the transmission line in comparison to a reference temperature, and then computing from the temperature of the line the current flow through the line. The reference temperature source is preferably a length of transmission line, exposed to similar ambient conditions as the portion of the transmission line in which current is to be measured, and arranged to conduct a known current which will heat it to a reference temperature close to that of the transmission line the current through which is to be measured.

DETAILED DESCRIPTION

Figure 1:
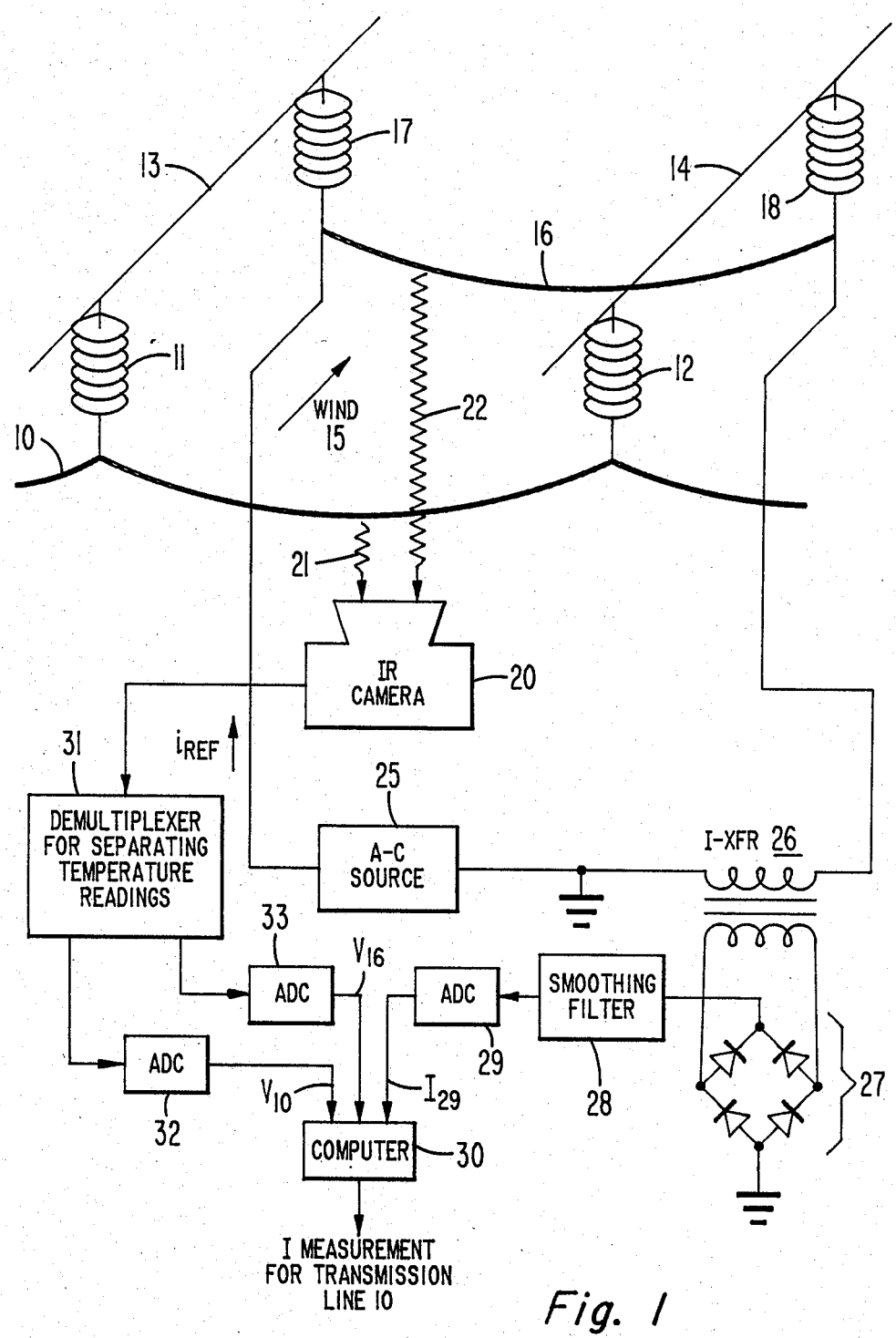
FIG. 1 is a schematic diagram of apparatus for measuring current flow in a HT transmission line, using an infrared camera in accordance with the invention.

In FIG. 1 a portion of a power transmission line 10 hangs between insulators 11 and 12 respectively supported in turn by the arms 13 and 14 of two adjacent transmission towers (only the arms 13 and 14 of which are shown in stylized form). It is desired to measure the current in transmission line 10 from its temperature, which may be reduced by a cooling crosswind 15 or by precipitation, or increased by exposure to sunlight. A length of reference transmission line 16, which is to be used as a source of reference temperature, is suspended between insulators 17 and 18 respectively connected to arms 13 and 14 of the two adjacent transmission towers so as to experience an ambient similar to the portion of transmission line 10 between those towers. (One may also arrange for the reference transmission line 16 to be carried between two support points on the same transmission tower.)

An infrared camera 20 is arranged to receive infrared radiation 21 from transmission line 10 and to receive infrared radiation 22 from transmission line length 16. Camera 20 maybe a staring (i.e., non-scanning) focal-plane-array type in which infrared images of portions of lines 10 and 16 are focussed on different parts a field array and the infrared responses to the two images are detected at different points in the regular scanning (e.g. raster scanning) of the field array. Or infrared camera 20 may be a scanning type of camera mechanically oscillated or manually turned to look first at a portion of line 16 and then at a portion of line 10. Preferably, where rainfall is to be expected, a rain shield (not shown) should be used to prevent rainfall through the line of sight between camera 20 and the portions of lines 10 and 16 it is measuring. It is desirable that the mounting position and optics of camera 20 be chosen so that images of the portions of lines 10 and 16 being measured fully overlap a plurality of infrared sensors in the array. A linear array of infrared sensing devices located along an axis perpendicular to portions of lines 10 and 16 can have images of the portions of lines 10 and 16 the temperatures of which are to be measured focussed on different portions of the array in another type of camera 20.

Line 16 is heated by passage of a reference current $i_{REF}$ therethrough to a reference temperature. Current $i_{REF}$ is shown supplied from an alternating current source 25, most conveniently operated in a range of 110 to 220 volts. Source 25 is provided with current-limiting, adjustable internal impedance. Making reference current $i_{REF}$ an alternating current simplifies its sensing and metering, using a current transformer 26 for sensing. A simple metering arrangement is shown, using a full-wave bridge 27 for rectification followed by a smoothing filter 28 to obtain average current level. A true r-m-s metering arrangement could be used instead of an average-current metering arrangement. The direct current that meters $i_{REF}$ amplitude is digitized in an analog-to-digital converter 29 and supplied as an input variable $I_{29}$ to a computer 30 for calculating the current flow in transmission line 10.

Voltages corresponding to the temperatures of the portions of lines 10 and 16 from which infrared camera 20 receives radiation are in effect supplied in a time division multiplexed form. They are separated by demultiplexer apparatus 31, then digitized in analog-to-digital converters 32 and 33 respectively, to supply computer 30 the remaining input variable $V_{10}$ and $V_{16}$ and necessary to determine the current flow in transmission line 10 as output variable. The demultiplexing maybe done on a split-field basis in a staring infrared camera, for example. Or, where a scanning IR camera is used, the demultiplexer will select image frames from times when the camera 20 images a portion of each line. Demultiplexer 31 is followed by analog-to-digital converters 32 and 33 for digitizing the voltages and $V_{10}$ and $V_{16}$ camera 20 supplies computer 30 descriptive of temperatures of lines 10 and 16, respectively. Latch circuitry is normally included in computer 30 inputs to hold digitize $V_{10}$ and $V_{16}$ between sampling times.

In descriptions below of the line temperatures as being the hottest detected by the infrared camera 20, it is assumed the camera images the lines against the relative coldness of the sky and is arranged not to "shoot into the sun." Of course, other cold backgrounds for thermal imaging can be arranged. It is preferable to make a-c source 25 an adjustable source, so the current it supplies can cause heating of transmission line 16 to approximately the same temperature as the portion of transmission line 10 carrying the current to be measured. This improves the compensation for cooling effects owing to wind and precipitation.

In some instances two closeby transmission lines similarly oriented with regard to the wind are available, one of which is metered for current and the other of which is not. This condition maybe encountered for example where an HT transmission line which is metered at a generating station supplies, through a distribution transformer, two distribution lines which are not metered. The HT transmission line from the generating station then may be used as the reference line, with infrared image information routed back to the generating station from an on-site infrared camera, for example. The measuring technique taught in this application is also useful where it is desired to make rough measurements of unknown current in a line, using portable measurement apparatus in an area where a transmission line carrying a known current is available. Current measurements can be made in several lines (e.g. those carrying the separate phases of a poly-phase a-c transmission) using only one reference line as a standard for temperature comparison.

Consider now the nature of the computations to be made in computer 30 of FIG. 1. At times computer 30 receives digitized voltage input $V_{16}$ samples indicative of the temperature of the portion of reference transmission line 16 being sensed by infrared camera 20. These samples are threshold-detected to determine whether they are below a threshold and so descriptive of relatively cold background, in which case they are discarded, or above a threshold and so descriptive of the relatively hot transmission line 16. The number of hot samples is also counted. The relatively hot samples are accumulated, or integrated, to detect an index of their average amplitude. This index of their average amplitude is then normalized by dividing by the number of samples, and the normalized index of the average amplitude of the hot samples is multiplied by the responsivity of infrared camera 20—i.e. its voltage response per degree change in absolute temperature. The resulting product describes the difference between ambient temperature and the temperature of line 16. The ambient temperature, as estimated, or as measured by thermometer or thermocouple, is added to the resulting product to determine the temperature $T_{16}$ of reference transmission line 16.

At other times computer 30 receives digitized voltage input $V_{10}$ samples indicative of the temperature of the portion of transmission line 10 being sensed by infrared camera 20. The temperature $T_{10}$ of transmission line 10 is computed from these samples similarly to the way the temperature $T_{16}$ of reference transmission line 16 was computed from the $V_{16}$ samples.

The temperature of a transmission line is to first order approximation proportional to the $I^2R$ loss per unit length. Infrared camera 20 is set up so equal lengths of lines 10 and 16 cross its viewing field, which can be checked with a video monitor responding to its video output to provide a television display, or which can be checked by an optical viewfinder mounted on the infrared camera 20. So the temperature of the transmission line is to first order approximation proportional to the $I^2R$ loss as measured by infrared camera 20. Where $T_{10}$ and $T_{16}$ are comparable in value these observations may be distilled into equation 1, following.

$$T_{10}/T_{16} = (I_{10}^2 R_{10})/(I_{16}^2 R_{16}) \qquad (1)$$

Here $I_{10}$ and $I_{16}$ are the direct currents giving heating equal to the currents actually flowing through transmission lines 10 and 16 respectively, which have respective resistances per unit length $R_{10}$ and $R_{16}$. Equation 10 can be solved for $I_{10}$ as follows:

$$I_{10} = I_{16}(R_{16}T_{10}/R_{10}T_{16})^{\frac{1}{2}} \qquad (2)$$

The current $I_{16}$ has the a-c current $i_{REF}$ as a heating equivalent, and $i_{REF}$ is linearly related to $I_{29}$.

$$I_{29} = [(N_{secondary}/N_{primary}) i_{REF}] \cdot k \qquad (3)$$

where
$N_{secondary}$ is the number of terms in I-XFR 26 secondary winding,
N
$N_{primary}$ is the number of turns in I-XFR 26 primary winding, and k is the ratio of the average current of a rectified sine wave to the r-m-s current of an unrectified sine ware—i.e. $(2/\pi)$ times peak value divided by $2^{-(\frac{1}{2})}$ times peak value=0.9.

Combining equations 2 and 3 to eliminate $I_{16}$, taking advantage of $I_{16}$ equalling $i_{REF}$, equation 4 is obtained, describing the computation computer 30 is called upon to make.

$$I_{10}=(I_{29}/k)(N_{primary}/N_{secondary})\cdot(T_{10}R_{16}/T_{16}R_{10})^{(\frac{1}{2})} \quad (4)$$

Where skin effects have been suppressed so $R_{10}$ and $R_{16}$ are bulk resistances $R_{10}$ and $R_{16}$ maybe expected to change with temperature as set forth in equations 5 and 6 following, where asterisked values are at a cold reference temperature.

$$R_{10}=R_{10}^{*}+(\delta R_{10}/\delta T)(T_{10}-T_{10}^{*}) \quad (5)$$

$$R_{16}=R_{16}^{*}+(\delta R_{16}/\delta T)(T_{16}-T_{16}^{*}) \quad (6)$$

The values of $R_{10}$ and $R_{16}$ as functions of temperature can be stored in table look-up read only memory in computer 30 or entered by the operator from tables he reads.

Where a-c source 25 output current $i_{REF}$ can be varied to equalize $T_{10}$ and $T_{16}$, and where the conductors in lines 10 and 16 are the same metal, $R_{16}/R_{10}$ will equal $R_{16}^{*}/R_{10}^{*}$, eliminating the need for table look-up to carry foward the computation $I_{10}$.

Where the current through transmission line 10 is sinusoidally alternating, rather than direct, $I_{10}$ will give its r-m-s value.

Where the metering of $i_{REF}$ is done using true r-m-s methods, k must be suitably modified, of course.

Still more accurate determination of $I_{10}$ can be computed where computer 30 has access to high-voltage transmission line temperature data characteristics compiled as a function of current and other temperature-affecting parameters such as solar heating, wind velocity and ambient temperature. Estimates of these other parameters deduced from observations and the values $T_{10}$ and $T_{16}$ are used with the compiled characteristics to refine the calculation of $I_{10}$.

Where a-c transmission lines are involved, it is the component of current giving rise to real power that is measured by the method of the invention. Computer 30, particularly where it is located at the substation and receives data from the current measurement site, can be arranged to receive inputs descriptive of transmission line voltages to compute real power flow through the transmission lines. Where the current flow through the transmission lines is metered by conventional current transformer techniques, inputs of these currents to computer 30 allow the calculation of power factor and of reactive power transmission.

The method of the invention is the first one known to the inventor which allows current flow at a point along a d-c transmission line to be monitored. Normally in d-c transmission current measurements have to be made on the generated a-c before its conversion to d-c.

Figure 2:
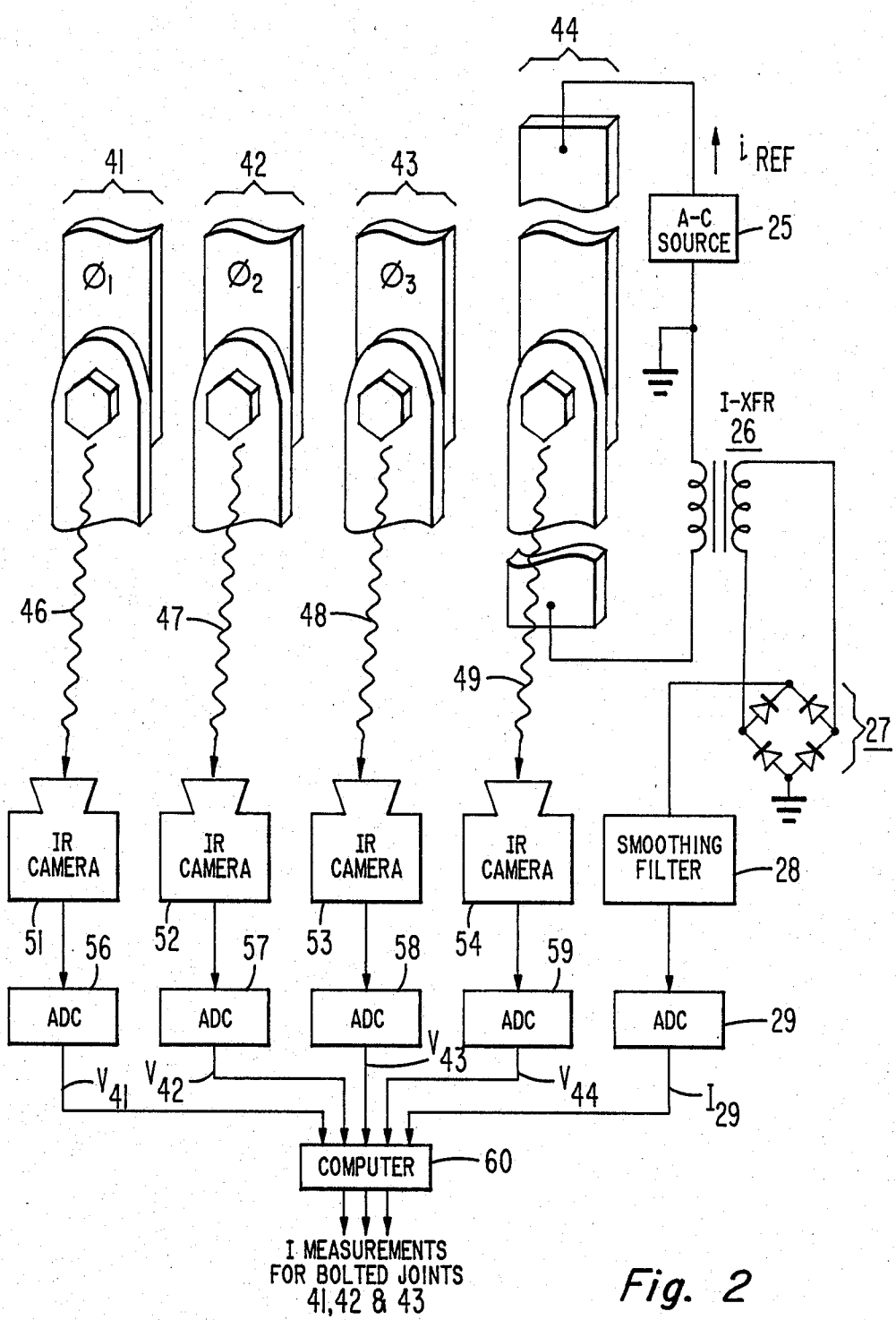
FIG. 2 is a schematic diagram of apparatus for measuring current flow through bolted joints between bus bars, using IR cameras in accordance with the invention.

FIG. 2 shows the bolted joints used in bus bar connections (for example, where a circuit breaker is connected in the substation to a poly-phase HT transmission line) being monitored by infrared cameras to measure current flows in the connections in accordance with the invention. Bolted joints 41, 42 and 43 respectively pass the first, second and third phases of three-phase power, respectively, to be heated thereby and emit infrared radiation to infrared cameras 51, 52 and 53 respectively. A similar bolted joint 44 with short lengths of associated bus bar is arranged to pass $i_{REF}$, which heats the joint so as to cause it to emit infrared 49 to an infrared camera 54. Cameras 51–54 are similar and are arranged to have like views of their respective bolted joints 41–44, as may be checked by a television monitor receiver or by optical viewfinders mounted on the cameras. Analog-to-digital converters 56, 57, 58 and 57 digitize the respective maximum output voltages $V_{51}$, $V_{52}$, $V_{53}$ and $V_{54}$ of IR cameras 51, 52, 53 and 54 for forwarding to a computer 60. Computer 60 also receives $I_{29}$ as an input variable, which is developed from $i_{REF}$ as in FIG. 1. Computer 60 computes the currents in bolted joints 41, 42 and 43 using the same techniques as computer 30 of FIG. 1.

It is emphasized that the current measuring technique of the invention is suitable to indoor measurement and to outdoor measurement, although indoor measurement generally does not require as many ambient conditions to be taken into consideration for accurate measurement.

It should be understood that the various temperature measurements in the current measuring method of the invention can be successively made using the same infrared camera to view the object carrying the current to be measured and the object heated to reference temperature by passage of a reference current through it. Or the two objects may be simultaneously imaged by the same camera and the images then separated using a dc multiplexer. Or a plurality of infrared cameras can be used to sense the temperatures object(s) carrying current to be measured and of the object heated to reference temperature. The temperatures of the current carrying objects may be sensed indirectly by viewing infrared emission from heat sinks into which the current-carrying objects dump heat.

Consider now the types of infrared camera suited for use in the present invention. The staring or scanning infrared cameras maybe solid-state infrared cameras of a type using an imager of the field array type, for example, or they maybe solid-state infrared cameras of a type using an imager of the line array type together with an oscillating mirror or the like to sweep a field optically. A consideration that has to be made in selecting an infrared camera is whether it has adequate sensitivity to temperature changes in the object being imaged. In a 220 kilovolt circuit breaker or overhead line conductor typically full load current would be 1000 to 2000 amperes. Typical conductor resistances in aluminum wrapped steel cable construction is 0.038 to 0.078 ohms per kilometer. For a 0.6 meter per second crosswind and 35° C. solar temperature the temperature of 510–45 HV aluminum steel line carrying 995 ampere rated current at 220 kilovolts would be 80° C. (With no wind the operator would have to reduce current by 30%.) So in this loading example the conductor temperature is 45° C. over ambient. If current is 10% of full load (which is more of a reduction in current than ever occurs in actual power systems) then the electric heating would drop to 1% of the loss at full load, and to a first order approximation conductor temperature would be only 0.45° C. over ambient. Conductor temperature can be sensed to an accuracy varying between 0.05° C. and 0.5° C. using solid state infrared cameras of the type using platinum silicide films for infrared sensing. These accuracies are obtainable presuming the images of lines being measured completely overlap a plurality of sensor elements in their thin dimension. These cameras require cryogenic cooling or thermoelectric cooling for operation, which maybe inconvenient in the field. Almost as great sensitivity to temperature change can be achieved using solid state cameras with pyroelectric infrared-sensing elements, which cameras can be satisfactorily operated at normal ambient temperatures. A pyroelectric detector/silicon charge-coupled-device hybrid focal plane array suitable for the application has been described by S. Isawa, D. Lamb and D. Paffel of Honeywell in their paper "MOSAIC CCD MULTIPLEXER FOR PYROELECTRIC HYBRID FOCAL PLANE" presented at the 5th International Conference on Charge Coupled Devices held in September 1979 at the University of Edinburgh and appearing in the Proceedings of that conference published by the university.

In the claims which follow the term "transmission line" is to be broadly construed to include any current conducting apparatus heated by conduction of current therethrough, including within its scope bolted joints, for example.

What is claimed is:

1. A method for measuring current in a transmission line comprising the steps of:
    establishing a reference transmission line exposed to similar ambient conditions as the transmission line in which current is to be measured;
    passing a measured current through said reference transmission line raising its temperature above ambient; and
    using at least one infrared detecting device to measure the temperatures of said reference transmission line and the transmission line in which current is to be measured;
    computing, from said measured current and from the respective measurements of the temperatures of said reference transmission line and said transmission line in which current is to be measured, the current sought to be measured.

2. A method for measuring current on a transmission line as set forth in claim 1, wherein to better compensate for wind factor, the following steps are added:
    adjusting the measured current through said reference transmission line to equalize the temperatures of said reference transmission line and said transmission line in which current is to be measured and
    arranging said reference transmission line and said transmission line in which current is to be measured to be nearby each other and substantially parallel where the infrared radiation to be detected is emitted.

3. One or more infrared cameras and a computer in combination, adapted for performing the penultimate and ultimate steps of the method of claim 1, particularly by the way in which said computer is arranged for performing computation.

4. Apparatus for determining the flow of current through a first conductor as compared to flow of current through a second conductor, said apparatus comprising:
    a computer for computing the current in said first conductor in relation to a first signal input descriptive of the current in said second conductor times a factor, said factor being computed as the square root of the quotient of a second signal input descriptive of the absolute temperature of said first conductor divided by a third signal input descriptive of the absolute temperature of said second conductor, said relation being in accordance with a factor depedent on the square root of the quotient of the resistance per unit length of said second conductor divided by the resistance per unit length of said first conductor;
    means for developing said first signal descriptive of the current in said conductor;
    means for sensing the infrared emitted per unit length from a portion of said first conductor;
    means for sensing the infrared emitted per unit length from a portion of said second conductor;
    means for converting the sensed infrared emission from said first conductor to a fourth signal descriptive of the temperature rise in said portion of said first conductor;
    means adding a fifth signal descriptive of the ambient temperature around said first and second conductors together with said fourth signal for generating said second signal;
    means for convering the infrared emission sensed from said second conductor to a sixth signal descriptive of the temperature rise in said portion of said second conductor; and
    means adding said fifth and sixth signals together for generating said third signal.

* * * * *